United States Patent
Wu et al.

(10) Patent No.: US 11,171,072 B2
(45) Date of Patent: Nov. 9, 2021

(54) HEAT DISSIPATION SUBSTRATE AND MANUFACTURING METHOD THEREOF

(71) Applicant: Subtron Technology Co., Ltd., Hsinchu County (TW)

(72) Inventors: Chien-Hung Wu, Hsinchu County (TW); Bo-Yu Huang, Hsinchu County (TW); Chia-Wei Chang, Hsinchu County (TW); Tzu-Shih Shen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 7 days.

(21) Appl. No.: 16/898,417

(22) Filed: Jun. 10, 2020

(65) Prior Publication Data

US 2021/0050276 A1 Feb. 18, 2021

(30) Foreign Application Priority Data

Aug. 12, 2019 (TW) ................................. 108128492

(51) Int. Cl.
 *H01L 23/367* (2006.01)
 *H05K 1/02* (2006.01)
 (Continued)

(52) U.S. Cl.
 CPC ........ *H01L 23/367* (2013.01); *H01L 21/4846* (2013.01); *H01L 21/4871* (2013.01);
 (Continued)

(58) Field of Classification Search
 CPC ............. H01L 23/367; H01L 23/49838; H01L 23/373–3738; H01L 33/647;
 (Continued)

(56) References Cited

U.S. PATENT DOCUMENTS 6,449,158 B1 * 9/2002 Wang ................... H01L 23/3735
 257/706
2012/0199955 A1 * 8/2012 Sun .................... H01L 23/49827
 257/629
(Continued)

FOREIGN PATENT DOCUMENTS

| CN | 107623986 | 1/2018 |
| TW | 201712816 | 4/2017 |

OTHER PUBLICATIONS

"Office Action of China Counterpart Application", dated Jul. 12, 2021, p. 1-p. 7.

*Primary Examiner* — Roshn K Varghese
(74) *Attorney, Agent, or Firm* — JCIPRNET

(57) ABSTRACT

A heat dissipation substrate includes a substrate, a heat conducting element, an insulating filling material, a first circuit layer, and a second circuit layer. The substrate has a first surface, a second surface opposite the first surface, and a through groove communicating the first surface with the second surface. The heat conducting element is disposed in the through groove. The heat conducting element includes an insulating material layer and at least one metal layer. The insulating filling material is filled in the through groove for fixing the heat conducting element into the through groove. The first circuit layer is disposed on the first surface of the substrate and exposes a portion of the heat conducting element. The second circuit layer is disposed on the second surface of the substrate. The first circuit layer and the metal layer are respectively disposed on two opposite sides of the insulating material layer.

6 Claims, 3 Drawing Sheets

(51) Int. Cl.
*H01L 33/64* (2010.01)
*H01L 21/48* (2006.01)
*H01L 23/498* (2006.01)

(52) U.S. Cl.
CPC ...... *H01L 23/49838* (2013.01); *H01L 33/642* (2013.01); *H01L 33/647* (2013.01); *H05K 1/021* (2013.01); *H05K 1/0204* (2013.01); *H01L 2933/0075* (2013.01)

(58) Field of Classification Search
CPC ... H01L 33/642; H01L 33/641; H01L 33/644; H01L 21/4871; H01L 21/4846; H01L 2933/0075; H01L 23/13; H01L 23/3677; H05K 1/0204; H05K 1/0205; H05K 1/0206; H05K 1/0207; H05K 1/0209; H05K 1/021; H05K 1/0212; H05K 2201/10416
See application file for complete search history.

(56) References Cited

U.S. PATENT DOCUMENTS

2019/0139853 A1* 5/2019 Oh ............................ H01L 24/20
2019/0198424 A1* 6/2019 Lam ....................... H01L 21/486

* cited by examiner

US 11,171,072 B2

HEAT DISSIPATION SUBSTRATE AND MANUFACTURING METHOD THEREOF

CROSS-REFERENCE TO RELATED APPLICATION

This application claims the priority benefit of Taiwan application serial no. 108128492, filed on Aug. 12, 2019. The entirety of the above-mentioned patent application is hereby incorporated by reference herein and made a part of this specification.

BACKGROUND

Technical Field

The disclosure relates to a substrate structure and a manufacturing method thereof, particularly to a heat dissipation substrate and a manufacturing method thereof.

Related Art

Generally, a heat dissipation substrate mainly includes a plurality of patterned circuit layers and at least one insulating layer, wherein the insulating layer is disposed between two adjacent patterned circuit layers in order to achieve an insulating effect. When a heat generating element (for example, a light emitting diode) is fixed on the heat dissipation substrate, heat generated by the heat generating element can be transmitted outside via the patterned circuit layers and the insulating layer to be dissipated. However, since the insulating layer has inferior thermal conductivity, when the heat generated by the heat generating element is transmitted outside via the insulating layer, thermal resistance increases, thereby impeding heat dissipation.

SUMMARY

The disclosure provides a heat dissipation substrate including an embedded heat conducting element and having both an insulation characteristic and a high heat dissipation effect.

The disclosure provides a manufacturing method of a heat dissipation substrate, which is for manufacturing the above heat dissipation substrate.

A heat dissipation substrate of the disclosure includes a substrate, a heat conducting element, an insulating filling material, a first circuit layer, and a second circuit layer. The substrate has a first surface, a second surface opposite the first surface, and a through groove communicating the first surface with the second surface. The heat conducting element is disposed in the through groove of the substrate. The heat conducting element includes an insulating material layer and at least one metal layer. The insulating filling material is filled in the through groove of the substrate for fixing the heat conducting element into the through groove of the substrate. The first circuit layer is disposed on the first surface of the substrate and exposes a portion of the heat conducting element. The second circuit layer is disposed on the second surface of the substrate. The first circuit layer and the metal layer are respectively located on two opposite sides of the insulating material layer.

In an embodiment of the disclosure, a thickness of the heat conducting element is T1, a thickness of the insulating material layer is T2, and $T2 < \frac{1}{2}T1$.

In an embodiment of the disclosure, the heat conducting element further includes a first conductive layer. The first conductive layer is disposed between the first circuit layer and the insulating material layer, and exposes a portion of the insulating material layer.

In an embodiment of the disclosure, the heat conducting element further includes a metal bonding layer. The metal bonding layer is disposed between the insulating material layer and the metal layer for connecting the insulating material layer and the metal layer.

In an embodiment of the disclosure, the heat conducting element further includes a second conductive layer. The second conductive layer is disposed between the insulating material layer and the metal bonding layer.

In an embodiment of the disclosure, a heat dissipation coefficient of the heat conducting element is greater than a heat dissipation coefficient of the substrate, and a heat dissipation coefficient of the insulating material layer is greater than the heat dissipation coefficient of the substrate.

In an embodiment of the disclosure, a material of the insulating material layer includes ceramic, silicon, silicon carbide, diamond or resin.

A manufacturing method of a heat dissipation substrate of the disclosure includes the following steps. A substrate is provided. The substrate has a first surface, and a second surface opposite the first surface. A through groove is formed, and the through groove communicates the first surface with the second surface of the substrate. A heat conducting element is disposed in the through groove of the substrate. The heat conducting element includes an insulating material layer and at least one metal layer. An insulating filling material is filled in the through groove of the substrate for fixing the heat conducting element into the through groove of the substrate. A first circuit layer is formed on the first surface of the substrate and exposes a portion of the heat conducting element. A second circuit layer is formed on the second surface of the substrate. The first circuit layer and the metal layer are respectively located on two opposite sides of the insulating material layer.

Based on the above, the disclosure provides a heat dissipation substrate and a manufacturing method thereof, wherein, since the heat dissipation substrate includes an embedded heat conducting element, and the heat conducting element includes an insulating material layer and at least one metal layer, the heat conducting element has both an insulation characteristic and a high heat dissipation effect.

To make the above features and advantages of the disclosure more comprehensible, examples accompanied with drawings are described in detail as follows.

DESCRIPTION OF THE EMBODIMENTS

Figure 1A:
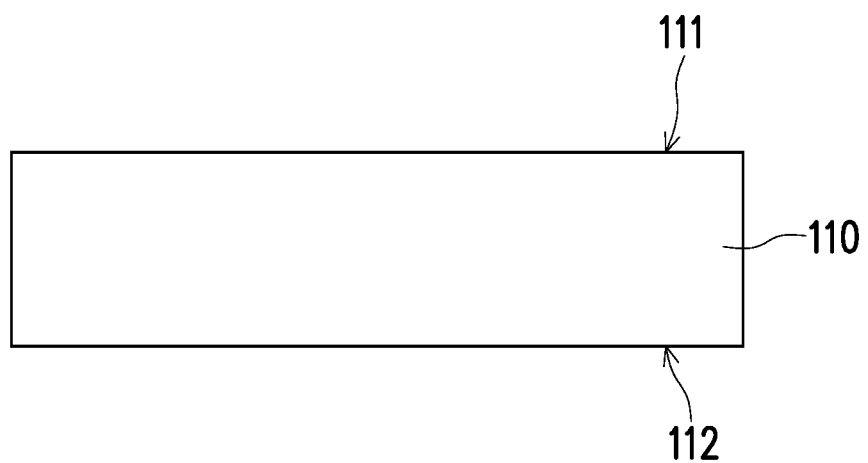
FIG. 1A to FIG. 1D illustrate schematic cross-sectional views of a manufacturing method of a heat dissipation substrate according to an embodiment of the disclosure.

FIG. 1A to FIG. 1D illustrate schematic cross-sectional views of a manufacturing method of a heat dissipation substrate according to an embodiment of the disclosure. Referring to FIG. 1A, firstly, a substrate 110 is provided. The substrate 110 has a first surface 111, and a second surface 112 opposite the first surface 111. In the present embodiment, a material of the substrate 110 is, for example but not limited to, an organic material.

Figure 1B:
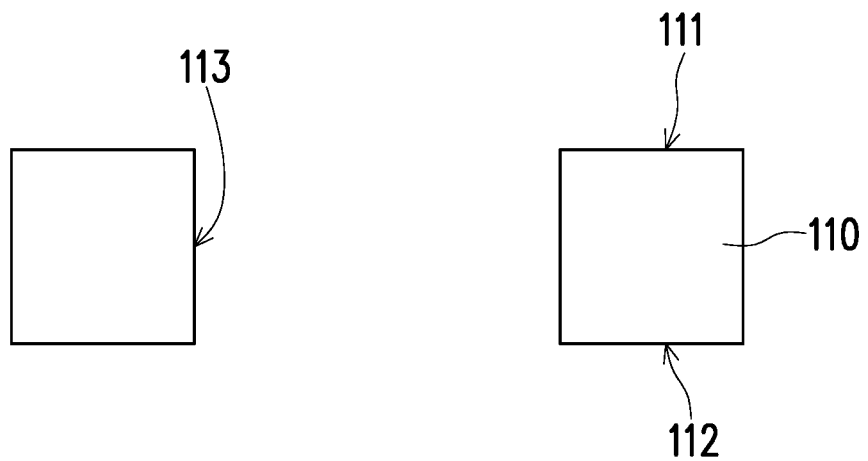

Next, referring to FIG. 1B, a through groove 113 is formed in the substrate 110 such that the through groove 113 communicates the first surface 111 with the second surface 112 of the substrate 110. A method for forming the through groove 113 is, for example but not limited to, punching or routing.

Figure 1C:
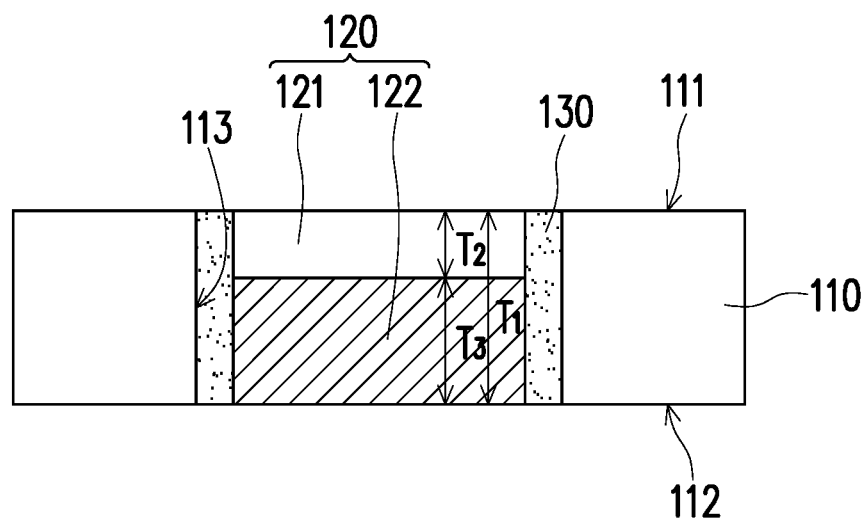

Referring to FIG. 1C, a heat conducting element 120 is disposed in the through groove 113 of the substrate 110 to form an embedded heat conducting element 120. Next, the insulating filling material 130 is filled in the through groove 113 of the substrate 110, that is, the insulating filling material 130 is filled in a gap between the heat conducting element 120 and the substrate 110 such that the insulating filling material 130 surrounds the heat conducting element 120, thereby fixing the heat conducting element 120 into the through groove 113 of the substrate 110.

Specifically, in the present embodiment, the heat conducting element 120 at least includes an insulating material layer 121 and at least one metal layer 122 (schematically shown as one layer in FIG. 1C). A heat dissipation coefficient of the heat conducting element 120 is greater than a heat dissipation coefficient of the substrate 110, and a heat dissipation coefficient of the insulating material layer 121 is greater than the heat dissipation coefficient of the substrate 110. For example, the heat dissipation coefficient of the heat conducting element 120 is, for example, 200 to 400 W/m*K, and is preferably 250 W/m*K; the heat dissipation coefficient of the insulating material layer 121 is, for example, 0.5 to 200 W/m*K, and is preferably 180 W/m*K; the heat dissipation coefficient of the substrate 110 is, for example, 0.5 W/m*K. In addition, a material of the insulating material layer 121 includes ceramic, silicon, silicon carbide, diamond, resin or other suitable insulating material, but is not limited thereto, as long as the heat dissipation coefficient of the insulating material layer 121 is greater than the heat dissipation coefficient of the substrate 110. A material of the metal layer 122 includes copper, gold, or other metal with a high heat dissipation coefficient.

More specifically, in the present embodiment, a thickness of the heat conducting element 120 is T1, a thickness of the insulating material layer 121 is T2, and a thickness of the metal layer 122 is T3. Since T2<T3 and T2<½T1, the heat conducting element 120 has both an insulation characteristic and a high heat dissipation effect. Further, in some embodiments, since the insulating material layer 121 has a significantly higher material cost than the metal layer 122, in the heat conducting element 120, by making the thickness T2 of the insulating material layer 121 smaller than the thickness T3 of the metal layer 122, and making the thickness T2 of the insulating material layer 121 smaller than half the thickness T1 of the heat conducting element 120, the material cost can be effectively reduced. For example, a ceramic standard has a thickness of 0.38 mm, and may become quite expensive when the thickness exceeds 0.38 mm, resulting in a significant increase in the material cost. Therefore, in some embodiments, when the thickness T1 of the substrate 110 is greater than 1 mm and the insulating material layer 121 is made of ceramic, the cost can be reduced by making the thickness T2 of the insulating material layer 121 equal to or smaller than half T1 (i.e., 0.5 mm).

Figure 1D:
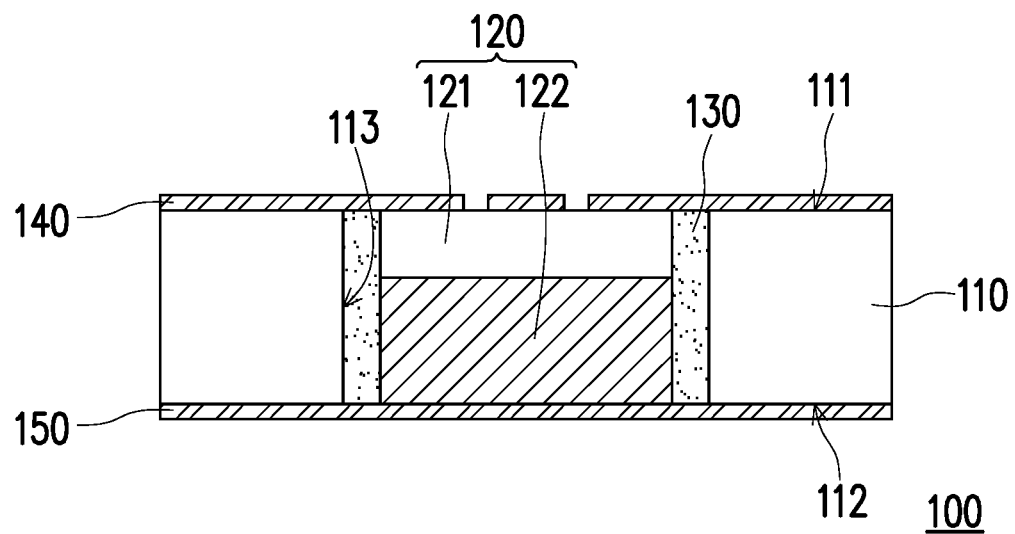

Then, referring to FIG. 1D, a first circuit layer 140 is formed on the first surface 111 of the substrate 110 and a second circuit layer 150 is formed on the second surface 112 of the substrate 110, such that the first circuit layer 140 and the second circuit layer 150 are respectively located on two opposite sides of the heat conducting element 120. The first circuit layer 140 covers the first surface 111 of the substrate 110, the insulating filling material 130, and a portion of the insulating material layer 121. In some embodiments, the first circuit layer 140 may expose a portion of the heat conducting element 120. The first circuit layer 140 and the metal layer 122 are respectively located on two opposite sides of the insulating material layer 121. The second circuit layer 150 covers the second surface 112 of the substrate 110, the insulating filling material 130 and the metal layer 122. In the present embodiment, a method for forming the first circuit layer 140 and the second circuit layer 150 is, for example but not limited to, an electroplating method. Thereby, the manufacture of the heat dissipation substrate 100 is completed.

In short, the heat dissipation substrate 100 of the present embodiment includes the substrate 110, the heat conducting element 120, the insulating filling material 130, the first circuit layer 140 and the second circuit layer 150. The substrate 110 has the first surface 111, the second surface 112 opposite the first surface 111, and the through groove 113 communicating the first surface 111 with the second surface 112. The heat conducting element 120 is disposed in the through groove 113 of the substrate 110. The heat conducting element 120 includes the insulating material layer 121 and at least one metal layer 122. The insulating filling material 130 is filled in the through groove 113 of the substrate 110 for fixing the heat conducting element 120 into the through groove 113 of the substrate 110. The first circuit layer 140 is disposed on the first surface 111 of the substrate 110 and exposes a portion of the heat conducting element 120. The second circuit layer 150 is disposed on the second surface 112 of the substrate 110. The first circuit layer 140 and the metal layer 122 are respectively located on two opposite sides of the insulating material layer 121. Since the heat dissipation substrate 100 includes the embedded heat conducting element 120, and the heat conducting element 120 includes the insulating material layer 121 and at least one metal layer 122, the heat conducting element 120 has both an insulation characteristic and a high heat dissipation effect.

It is worth noting that the heat dissipation substrate 100 of the present embodiment may be used to carry a heat generating element (not shown) and provides a good heat dissipation effect. The heat generating element is, for example but not limited to, an electronic chip or a photoelectric element. The electronic chip may be an integrated circuit chip, for example, a single chip such as a graphics chip, a memory chip, a semiconductor chip or the like, or a chip module. The photoelectric element is, for example, a light emitting diode (LED), a laser diode, or a gas discharge light source or the like.

For example, in a case of using a light emitting diode (LED) as the heat generating element, the LED may be disposed on the first circuit layer 140 of the heat dissipation substrate 100 of the present embodiment, and the LED is disposed corresponding to the heat conducting element 120. Next, the LED is electrically connected to the first circuit layer 140 of the heat dissipation substrate 100 by, for example, wire bonding. Therefore, heat generated by the LED can be promptly transmitted outside via the heat conducting element 120 below the LED. In this way, the heat dissipation substrate 100 of the present embodiment is capable of effectively dissipating the heat generated by the LED, thereby improving the use efficiency and service life of the LED.

It is to be noted that, although the above describes an example in which an LED is used as the heat generating element and the LED is electrically connected to the first circuit layer 140 of the heat dissipation substrate 100 by wire bonding, the type of the heat generating element and the bonding form between the heat generating element and the heat dissipation substrate 100 are not limited in the disclosure. That is, in other embodiments, the heat generating element may be electrically connected to the first circuit layer of the heat dissipation substrate by flip chip bonding via a plurality of bumps (not shown). In some embodiments, the heat generating element may be a chip package (not shown) and mounted to the heat dissipation substrate by surface mount technology (SMT).

Other embodiments are mentioned below for illustration. It should be noted that the reference numerals and a part of the contents in the previous embodiment are used in the following embodiments, in which identical reference numerals indicate identical or similar elements, and repeated description of the same technical contents is omitted. For a description of the omitted parts, reference can be found in the previous embodiment, and no repeated description is contained in the following embodiments.

Figure 2:
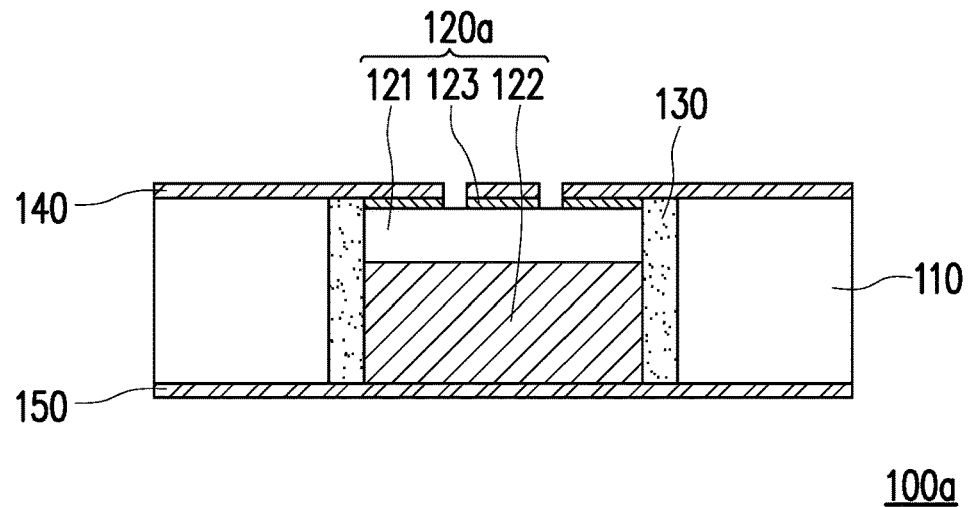
FIG. 2 illustrates a schematic cross-sectional view of a heat dissipation substrate according to another embodiment of the disclosure.

FIG. 2 illustrates a schematic cross-sectional view of a heat dissipation substrate according to another embodiment of the disclosure. Referring to FIG. 1D and FIG. 2 together, a heat dissipation substrate 100a of the present embodiment is similar to the heat dissipation substrate 100 of FIG. 1D, and they mainly differ in that a heat conducting element 120a of the heat dissipation substrate 100a further includes a first conductive layer 123 to cover the insulating material layer 121. The first conductive layer 123 is disposed between the first circuit layer 140 and the insulating material layer 121. The first conductive layer 123 and the metal layer 122 are respectively located on two opposite sides of the insulating material layer 121. In some embodiments, the first conductive layer 123 may expose a portion of the insulating material layer 121. A material of the first conductive layer 123 is, for example but not limited to, copper.

Figure 3:
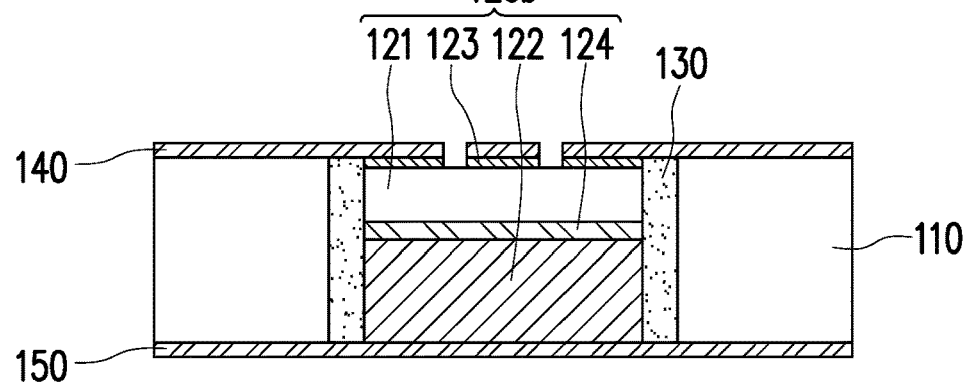
FIG. 3 illustrates a schematic cross-sectional view of a heat dissipation substrate according to another embodiment of the disclosure.

FIG. 3 illustrates a schematic cross-sectional view of a heat dissipation substrate according to another embodiment of the disclosure. Referring to FIG. 2 and FIG. 3 together, a heat dissipation substrate 100b of the present embodiment is similar to the heat dissipation substrate 100a of FIG. 2, and they mainly differ in that a heat conducting element 120b of the heat dissipation substrate 100b further includes a metal bonding layer 124. The metal bonding layer 124 is disposed between the insulating material layer 121 and the metal layer 122 for connecting the insulating material layer 121 and the metal layer 122. A material of the metal bonding layer 124 is, for example but not limited to, solder paste or gold.

Figure 4:
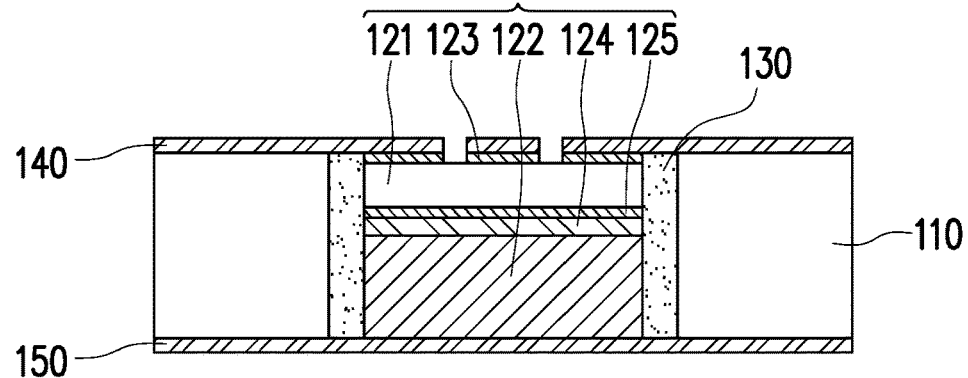
FIG. 4 illustrates a schematic cross-sectional view of a heat dissipation substrate according to another embodiment of the disclosure.

FIG. 4 illustrates a schematic cross-sectional view of a heat dissipation substrate according to another embodiment of the disclosure. Referring to FIG. 3 and FIG. 4 together, a heat dissipation substrate 100c of the present embodiment is similar to the heat dissipation substrate 100b of FIG. 3, and they mainly differ in that a heat conducting element 120c of the heat dissipation substrate 100c further includes a second conductive layer 125. The second conductive layer 125 is disposed between the insulating material layer 121 and the metal bonding layer 124. A material of the second conductive layer 125 is, for example but not limited to, copper.

In summary, the disclosure provides a heat dissipation substrate and a manufacturing method thereof, wherein, since the heat dissipation substrate includes an embedded heat conducting element, and the heat conducting element includes an insulating material layer and at least one metal layer, the heat conducting element has both an insulation characteristic and a high heat dissipation effect.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A heat dissipation substrate comprising:
a substrate, having a first surface, a second surface opposite the first surface, and a through groove communicating the first surface with the second surface;
a heat conducting element, disposed in the through groove of the substrate, the heat conducting element comprising an insulating material layer and at least one metal layer;
an insulating filling material, filled in the through groove of the substrate for fixing the heat conducting element into the through groove of the substrate;
a first circuit layer, disposed on the first surface of the substrate and exposing a portion of the heat conducting element; and
a second circuit layer, disposed on the second surface of the substrate, wherein the first circuit layer and the metal layer are respectively located on two opposite sides of the insulating material layer,
wherein a thickness of the heat conducting element is T1, a thickness of the insulating material layer is T2, and T2<½T1,
wherein a heat dissipation coefficient of the heat conducting element is greater than a heat dissipation coefficient of the substrate, and a heat dissipation coefficient of the insulating material layer is greater than the heat dissipation coefficient of the substrate.

2. The heat dissipation substrate according to claim 1, wherein the heat conducting element further comprises a first conductive layer disposed between the first circuit layer and the insulating material layer and exposing a portion of the insulating material layer.

3. The heat dissipation substrate according to claim 2, wherein the heat conducting element further comprises a metal bonding layer disposed between the insulating material layer and the metal layer for connecting the insulating material layer and the metal layer.

4. The heat dissipation substrate according to claim 3, wherein the heat conducting element further comprises a second conductive layer disposed between the insulating material layer and the metal bonding layer.

5. The heat dissipation substrate according to claim 1, wherein a material of the insulating material layer comprises ceramic, silicon, silicon carbide, diamond or resin.

6. A manufacturing method of a heat dissipation substrate, comprising:
providing a substrate, the substrate having a first surface and a second surface opposite the first surface;
forming a through groove communicating the first surface with the second surface of the substrate;
disposing a heat conducting element in the through groove of the substrate, the heat conducting element comprising an insulating material layer and at least one metal layer;

filling an insulating filling material in the through groove of the substrate for fixing the heat conducting element into the through groove of the substrate;

forming a first circuit layer on the first surface of the substrate, the first circuit layer exposing a portion of the heat conducting element; and forming a second circuit layer on the second surface of the substrate, wherein the first circuit layer and the metal layer are respectively located on two opposite sides of the insulating material layer, wherein a thickness of the heat conducting element is T1, a thickness of the insulating material layer is T2, and T2<½T1, wherein a heat dissipation coefficient of the heat conducting element is greater than a heat dissipation coefficient of the substrate, and a heat dissipation coefficient of the insulating material layer is greater than the heat dissipation coefficient of the substrate.

\* \* \* \* \*